(12) United States Patent
Zhao et al.

(10) Patent No.: US 12,374,861 B2
(45) Date of Patent: Jul. 29, 2025

(54) MULTI-WAVELENGTH LASER AND WAVELENGTH CONTROL METHOD

(71) Applicant: HUAWEI TECHNOLOGIES CO., LTD., Guangdong (CN)

(72) Inventors: Zhuang Zhao, Dongguan (CN); Xu Sun, Shenzhen (CN); Zhenqing Zhao, Dongguan (CN); Jinlin Zeng, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 741 days.

(21) Appl. No.: 17/680,851

(22) Filed: Feb. 25, 2022

(65) Prior Publication Data
US 2022/0181845 A1 Jun. 9, 2022

Related U.S. Application Data

(63) Continuation of application No. PCT/CN2020/109669, filed on Aug. 18, 2020.

(30) Foreign Application Priority Data

Aug. 30, 2019 (CN) .......................... 201910816476.5

(51) Int. Cl.
*H01S 3/00* (2006.01)
*H01S 5/042* (2006.01)
(Continued)

(52) U.S. Cl.
CPC ........ *H01S 5/04256* (2019.08); *H01S 5/0425* (2013.01); *H01S 5/04257* (2019.08);
(Continued)

(58) Field of Classification Search
CPC .............. H01S 5/04256; H01S 5/0425; H01S 5/04257; H01S 5/06253; H01S 5/06255; H01S 5/0657; H01S 5/34
See application file for complete search history.

(56) References Cited

U.S. PATENT DOCUMENTS 5,187,717 A 2/1993 Horita et al.
6,031,851 A 2/2000 Shimizu et al.
(Continued)

FOREIGN PATENT DOCUMENTS

CN 102074891 A 5/2011
CN 102227854 A 10/2011
(Continued)

*Primary Examiner* — Kinam Park
(74) *Attorney, Agent, or Firm* — WOMBLE BOND DICKINSON (US) LLP

(57) ABSTRACT

A multi-wavelength laser and a wavelength control method are disclosed. The multi-wavelength laser includes a waveguide, a first electrode, and a second electrode. The first electrode and the second electrode are disposed on the waveguide. The first electrode is electrically isolated from the second electrode. The first electrode includes a plurality of sub-electrodes, and every two adjacent sub-electrodes are electrically isolated. The second electrode is configured to amplify an optical signal in the waveguide by loading a current. At least one sub-electrode is configured to adjust a wavelength of the optical signal in the waveguide by loading a current or a voltage.

12 Claims, 6 Drawing Sheets

(51) Int. Cl.
*H01S 5/0625* (2006.01)
*H01S 5/065* (2006.01)
*H01S 5/34* (2006.01)

(52) U.S. Cl.
CPC ...... *H01S 5/06253* (2013.01); *H01S 5/06255* (2013.01); *H01S 5/0657* (2013.01); *H01S 5/34* (2013.01)

(56) References Cited

U.S. PATENT DOCUMENTS

| | | |
|---|---|---|
| 2007/0258494 A1 | 11/2007 | Davies et al. |
| 2011/0216788 A1* | 9/2011 | Oki ................. H01S 5/0658 372/18 |
| 2014/0307750 A1* | 10/2014 | Kono ............... H01S 5/0657 372/18 |
| 2014/0376575 A1* | 12/2014 | Kono ............. H01S 5/34333 372/18 |
| 2018/0054039 A1* | 2/2018 | Watanabe ......... H01S 5/06253 |
| 2018/0205200 A1 | 7/2018 | Kwon et al. |

FOREIGN PATENT DOCUMENTS

| | | |
|---|---|---|
| CN | 102255239 A | 11/2011 |
| CN | 105071219 A | 11/2015 |
| CN | 108471046 A | 8/2018 |
| EP | 0559192 A2 | 9/1993 |
| JP | H0936480 A | 2/1997 |
| WO | 02063731 A2 | 8/2002 |

\* cited by examiner

MULTI-WAVELENGTH LASER AND WAVELENGTH CONTROL METHOD

CROSS-REFERENCE TO RELATED APPLICATIONS

This application is a continuation of International Patent Application No. PCT/CN2020/109669, filed on Aug. 18, 2020, which claims priority to Chinese Patent Application No. 201910816476.5, filed on Aug. 30, 2019. The disclosures of the aforementioned applications are hereby incorporated by reference in their entireties.

TECHNICAL FIELD

This application relates to the field of optical communication, and in particular, to a multi-wavelength laser and a wavelength control method.

BACKGROUND

With development of high-capacity optical fiber communication networks, multi-wavelength laser light sources that simultaneously provide light sources for a plurality of channels are increasingly used. A multi-wavelength laser light source can make a design of a transmitter more compact and reduce costs and power consumption greatly. Therefore, the light source is key to expansion of an optical fiber communication system.

A mode-locked laser (MLL) is a kind of multi-wavelength light source. The mode-locked laser includes two parts: a gain region and a saturable-absorber region. The two parts share a same waveguide, and electrodes corresponding to the two parts are electrically isolated by an electrical isolation groove. During operation, the gain region forms gains by loading a forward current, and the saturable-absorber region controls a nonlinear saturable absorption characteristic in a laser cavity of the mode-locked laser by loading a reverse bias voltage. In other words, a light absorption coefficient of the laser cavity decreases as light intensity increases. Absorption stops when the absorption reaches saturation, so that the multi-wavelength laser implements mode-locking. In this way, the laser outputs pulses with narrow widths in time domain and outputs a plurality of wavelengths in frequency domain. At present, the mode-locked laser generally implements wavelength adjustment through temperature control. Specifically, a packaging structure of the mode-locked laser includes a thermoelectric cooler (TEC). A temperature change of the TEC will affect an operating temperature of the mode-locked laser. For example, as the temperature increases, a wavelength of an optical signal transmitted by the mode-locked laser becomes longer.

However, because heat transfer requires time, the operating temperature of the mode-locked laser does not change immediately as the temperature of the TEC changes, resulting in relatively long time for adjusting an output wavelength of the laser.

SUMMARY

Embodiments of this application provide a multi-wavelength laser and a wavelength control method, so as to shorten time for adjusting a wavelength of an optical signal.

According to a first aspect, an embodiment of this application provides a multi-wavelength laser, including a waveguide, a first electrode, and a second electrode. The first electrode and the second electrode are disposed on the waveguide. The first electrode is electrically isolated from the second electrode. The first electrode includes a plurality of sub-electrodes, and every two adjacent sub-electrodes are electrically isolated. The second electrode is configured to amplify an optical signal in the waveguide by loading a current. At least one sub-electrode is configured to control a wavelength range of an optical signal in the waveguide by loading a current or a voltage.

In an embodiment, the first electrode includes a plurality of sub-electrodes, and a working length of the first electrode is a total length of sub-electrodes onto which a current or a voltage is loaded. Different lengths may be selected as required. A change of the working length causes different optical field energy in the waveguide, and further causes different temperatures in the waveguide, so that the multi-wavelength laser can transmit optical signals with different wavelength ranges. The multi-wavelength laser can adjust a temperature in the waveguide more quickly and therefore shorten wavelength control time.

In an embodiment, each sub-electrode has a different length. Therefore, the first electrode may have more possible working lengths, and therefore an adjustable wavelength range of the optical signal is larger.

In an embodiment, the first electrode has a first length, the second electrode has a second length, the first length is a sum of lengths of all the sub-electrodes, a ratio of the first length to a third length is less than or equal to 12%, and the third length is a sum of the first length and the second length. In this embodiment, because a longer first length causes a larger drive current required by the multi-wavelength laser for generating laser light, this design can reduce driving power consumption of the multi-wavelength laser.

In an embodiment, the multi-wavelength laser further includes a controller, a plurality of switches, and a current source. The plurality of switches are in a one-to-one correspondence with the plurality of sub-electrodes. One end of each switch is connected to a sub-electrode corresponding to the switch, and the other end of the switch is connected to the current source. The second electrode is connected to the current source. The controller is configured to control each switch. In this embodiment, a specific implementation of loading a current onto a sub-electrode is provided, thereby improving practicability of this solution.

In an embodiment, the multi-wavelength laser further includes a first voltage source, and the current source includes a first current source. The second electrode is connected to the first current source, one end of each switch is connected to the first current source, and the other end of the switch is connected to the first voltage source. The controller is configured to control each switch to connect to the first current source or the first voltage source. In this implementation, each switch may be controlled to connect to a current source or a voltage source, thereby improving scalability of this solution.

In an embodiment, the multi-wavelength laser further includes a plurality of second voltage sources, the plurality of second voltage sources are in a one-to-one correspondence with the plurality of switches, and the current source includes the first current source. The second electrode is connected to the first current source, one end of each switch is connected to the first current source, and the other end of the switch is connected to a second voltage source corresponding to the switch. The controller is configured to control each switch to connect to the first current source or the second voltage source corresponding to the switch. In this implementation, a magnitude of a voltage loaded onto each sub-electrode affects a wavelength of an optical signal in the waveguide. Therefore, when each sub-electrode is connected to a different voltage source, an adjustable wavelength range of the optical signal in the waveguide may be larger.

In an embodiment, the multi-wavelength laser further includes a plurality of second voltage sources, the plurality of second voltage sources are in a one-to-one correspondence with the plurality of switches, the current source includes the first current source and a plurality of second current sources, and the plurality of second current sources are in a one-to-one correspondence with the plurality of switches. The second electrode is connected to the first current source, one end of each switch is connected to a second current source corresponding to the switch, and the other end of the switch is connected to a second voltage source corresponding to the switch. The controller is configured to control each switch to connect to the second current source corresponding to the switch or the second voltage source corresponding to the switch. In this implementation, a magnitude of a current loaded onto each sub-electrode also affects a wavelength of an optical signal in the waveguide. Therefore, when each sub-electrode is connected to a different current source, an adjustable wavelength range of the optical signal in the waveguide may also be larger. In addition, each sub-electrode may be connected to a corresponding current source or may be connected to a corresponding voltage source. Therefore, an adjustment mode is more flexible.

In an embodiment, the first electrode is disposed on one side of the second electrode, or the first electrode is disposed on two sides of the second electrode, so that the multi-wavelength laser may have more possible structures.

In an embodiment, a material of the waveguide includes at least one or more of the following: a semiconductor quantum dot, a semiconductor quantum wire, or a semiconductor quantum well of gallium arsenide (GaAs), indium gallium arsenide (InGaAs), and indium phosphide (InP). In this embodiment, several waveguide materials are provided, thereby improving implementability of this solution.

According to a second aspect, an embodiment of this application provides a wavelength control method. The method includes the operations as described below.

A multi-wavelength laser obtains a correspondence between a length of a first electrode and a wavelength of an optical signal in a waveguide, where the first electrode is disposed on the waveguide, the first electrode includes a plurality of sub-electrodes, and every two adjacent sub-electrodes are electrically isolated. Then, the multi-wavelength laser selects at least one sub-electrode from the first electrode according to the correspondence. Further, the multi-wavelength laser controls a wavelength range of the optical signal by loading a current or a voltage onto the at least one sub-electrode and amplifies the optical signal by loading a current onto a second electrode, where the second electrode is disposed on the waveguide, and the first electrode is electrically isolated from the second electrode.

In an embodiment, each sub-electrode is connected to a first current source through a switch corresponding to the sub-electrode, or each sub-electrode is connected to a first voltage source through a switch corresponding to the sub-electrode; and the controlling a wavelength range of the optical signal by loading a current or a voltage onto the at least one sub-electrode includes: controlling the wavelength range of the optical signal by connecting a switch corresponding to the at least one sub-electrode to the first current source or the first voltage source.

In an embodiment, each sub-electrode is connected to a second current source corresponding to each switch through a switch corresponding to the sub-electrode, or each sub-electrode is connected to a second voltage source corresponding to each switch through a switch corresponding to the sub-electrode; and the adjusting a wavelength range of the optical signal by loading a current or a voltage onto the at least one sub-electrode includes: controlling the wavelength range of the optical signal by connecting a switch corresponding to the at least one sub-electrode to the second current source or the second voltage source.

In an embodiment, each sub-electrode has a different length.

In an embodiment, the first electrode has a first length, the second electrode has a second length, the first length is a sum of lengths of all the sub-electrodes, a ratio of the first length to a third length is less than or equal to 12%, and the third length is a sum of the first length and the second length.

In an embodiment, the first electrode is disposed on one side of the second electrode, or the first electrode is disposed on two sides of the second electrode.

For details about a material of the waveguide, refer to specific descriptions of the first aspect. Details are not described herein again.

It may be learned from the foregoing technical solution that the embodiments of this application have the following advantages: the first electrode includes a plurality of sub-electrodes, a working length of the first electrode is a total length of sub-electrodes onto which a current or a voltage is loaded, and a wavelength range of a transmitted optical signal is controlled by changing the working length of the first electrode, thereby shortening wavelength control time.

DESCRIPTION OF EMBODIMENTS

Embodiments of this application provide a multi-wavelength laser and a wavelength control method, so that the multi-wavelength laser can transmit optical signals with different wavelength ranges in a manner of loading a voltage or a current. Compared with a TEC temperature control technology, the technical solution disclosed in this application can adjust a temperature in a waveguide more quickly, thereby shortening time for adjusting a wavelength of an optical signal. It should be noted that the multi-wavelength laser in this application may be a mode-locked laser. A wavelength range may also be referred to as a wave band.

It should be noted that the terms "first", "second", "third", "fourth", and the like in the specification, claims, and accompanying drawings of this application are used to distinguish between similar objects, but do not limit a specific sequence or sequence. It should be understood that the foregoing terms are interchangeable in proper circumstances, so that the embodiments described in this application can be implemented in other orders rather than the content described in this application. Moreover, the terms "include", "have", or any other variant thereof are intended to cover a non-exclusive inclusion. For example, a process, method, system, product, or device that includes a series of operations or units is not necessarily limited to those expressly listed operations or units, but may include other operations or units not expressly listed or inherent to such a process, method, product, or device.

Figure 1:
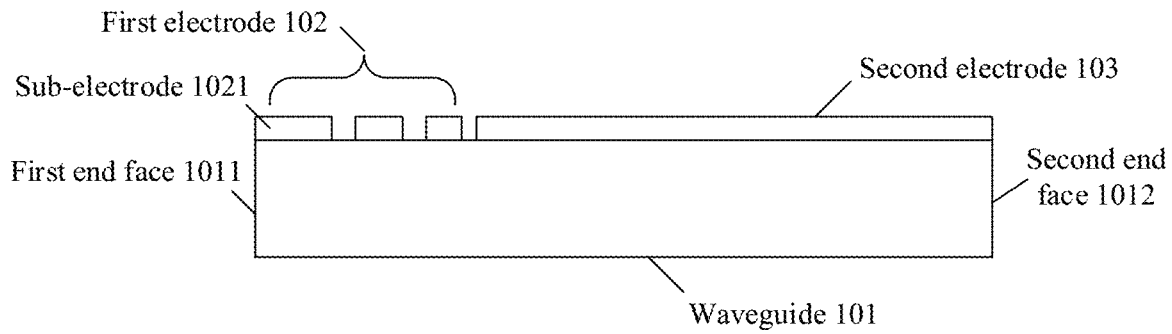
FIG. 1 is a schematic diagram of a structure of a first-type multi-wavelength laser according to an embodiment of this application.

FIG. 1 is a schematic diagram of a structure of a first-type multi-wavelength laser according to an embodiment of this application. The multi-wavelength laser includes a waveguide 101, a first electrode 102, and a second electrode 103. The first electrode 102 and the second electrode 103 are disposed on the waveguide 101, and the first electrode 102 is electrically isolated from the second electrode 103, that is, there is a gap between the first electrode 102 and the second electrode 103. For example, the waveguide 101 may be first covered with a complete layer of electrode, and then the electrode is grooved. In this case, one side of the groove is the first electrode 102, and the other side of the groove is the second electrode 103.

It should be noted that the first electrode 102 includes a plurality of sub-electrodes 1021, and every two adjacent sub-electrodes 1021 are electrically isolated. For example, as shown in FIG. 1, the first electrode 102 may be divided into three sub-electrodes 1021 by two grooves. It may be understood that, a quantity of sub-electrodes 1021 of the first electrode 102 is subject to an actual application, and is not limited herein. In addition, a size of the groove between the first electrode 102 and the second electrode 103 and a size of the groove between two adjacent sub-electrodes 1021 of the first electrode 102 are subject to an actual application, and are not limited herein.

The first electrode 102 and the second electrode 103 are further described below. Specifically, a wavelength range of an optical signal in the waveguide 101 is controlled by loading a current or a voltage onto at least one sub-electrode 1021 of the first electrode 102, so that the multi-wavelength laser transmits optical signals with different wavelength ranges. A working length of the first electrode 102 is a total length of sub-electrodes 1021 onto which a voltage or a current is loaded. It should be noted that, different working lengths of the first electrode 102 cause different optical field energy in the waveguide 101, and further cause different temperatures in the waveguide 101, so that the laser transmits optical signals with different wavelength ranges. The second electrode 103 implements population inversion by loading a current to amplify the optical signal in the waveguide 101.

It should be noted that the multi-wavelength laser may output multi-wavelength signals by using a mode-locking technology. To be specific, the laser outputs pulses with relatively narrow widths in time domain through mode-locking, thereby outputting a plurality of wavelengths in frequency domain. It should be understood that mode-locking may be implemented by loading either a voltage or a current onto the first electrode 102. In a first case, the voltage loaded onto the first electrode 102 may refer to a reverse bias voltage, so as to implement a saturable absorption characteristic of the waveguide 101. In other words, a light absorption coefficient of the waveguide 101 decreases as a light intensity increases, and absorption stops when the absorption reaches saturation. In this way, the multi-wavelength laser implements mode-locking. In another case, a current is loaded onto the first electrode 102, and the multi-wavelength laser implements mode-locking because of four-wave mixing nonlinear effects.

For example, the multi-wavelength laser in this application is a mode-locked laser. The first electrode corresponds to a saturable-absorber region of the mode-locked laser, and the second electrode corresponds to a gain region of the mode-locked laser.

Figure 2:
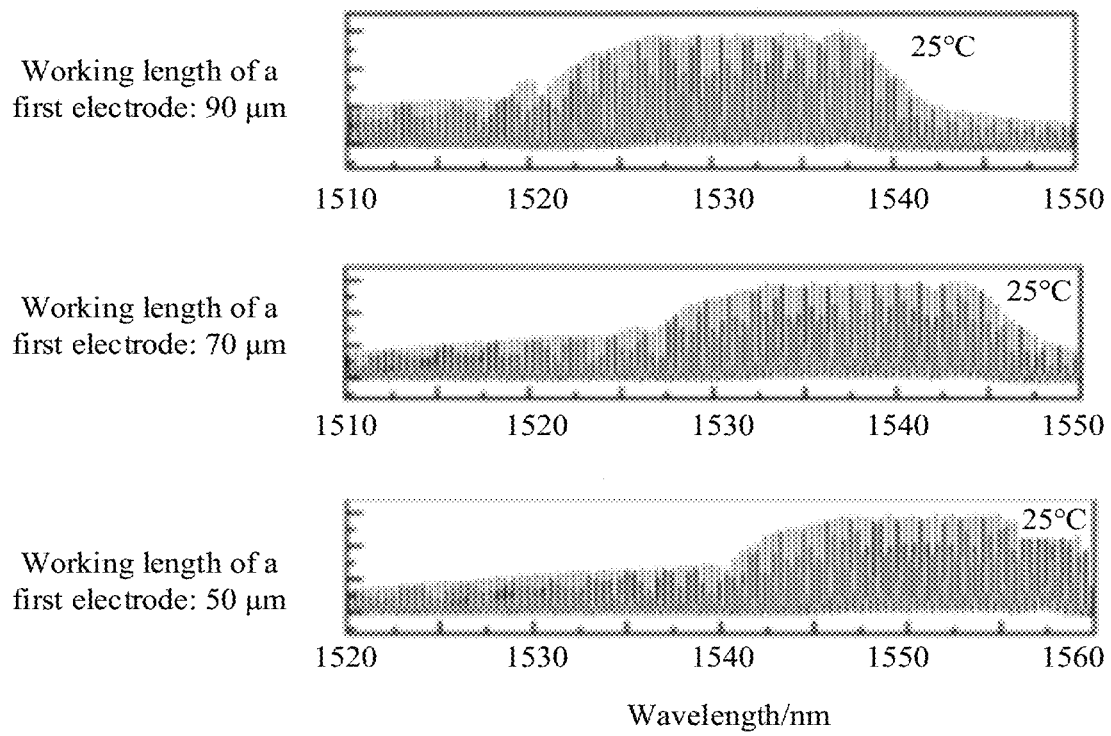
FIG. 2 is a schematic diagram showing that a wavelength of a transmitted signal of a multi-wavelength laser changes with a working length of a first electrode.

FIG. 2 is a schematic diagram showing that a wavelength of a transmitted signal of a multi-wavelength laser changes with a working length of a first electrode. It may be learned from FIG. 2 that a center wavelength of the transmitted signal changes with the working length of the first electrode. Specifically, when the working length of the first electrode 102 is 90 μm, the center wavelength of the transmitted signal is 1532 nm. When the working length of the first electrode 102 is 70 μm, the center wavelength of the transmitted signal is 1537 nm. When the working length of the first electrode 102 is 50 μm, the center wavelength of the transmitted signal is 1550 nm.

For example, lengths of the three sub-electrodes 1021 shown in FIG. 1 are respectively denoted as a, b, and c. The working length of the first electrode may be a, b, c, a+b, a+c, b+c, or a+b+c. It is assumed that a=50 μm, b=20 μm, and c=20 μm. Refer to FIG. 2. When the working length of the first electrode is a+b+c, the center wavelength of the transmitted signal is 1532 nm. When the working length of the first electrode is a+b or a+c, the center wavelength of the transmitted signal is 1537 nm. When the working length of the first electrode is a, the center wavelength of the transmitted signal is 1550 nm.

It should be noted that a length of each sub-electrode 1021 may be the same or may be different. This is not limited herein. In an embodiment, the length of each sub-electrode 1021 is set to be different, so that the first electrode may have more possible working lengths, and therefore an adjustable wavelength range of the transmitted signal is larger.

In an embodiment, a longer working length of the first electrode 102 causes a larger drive current required by the multi-wavelength laser for generating laser light. To enable the laser light generated by the multi-wavelength laser to require a relatively small drive current, a ratio of a length of the first electrode 102 to a total length of electrodes (including the first electrode 102 and the second electrode 103) is less than or equal to 12%, that is, a proportion of the first electrode is less than or equal to 12%.

Figure 3:
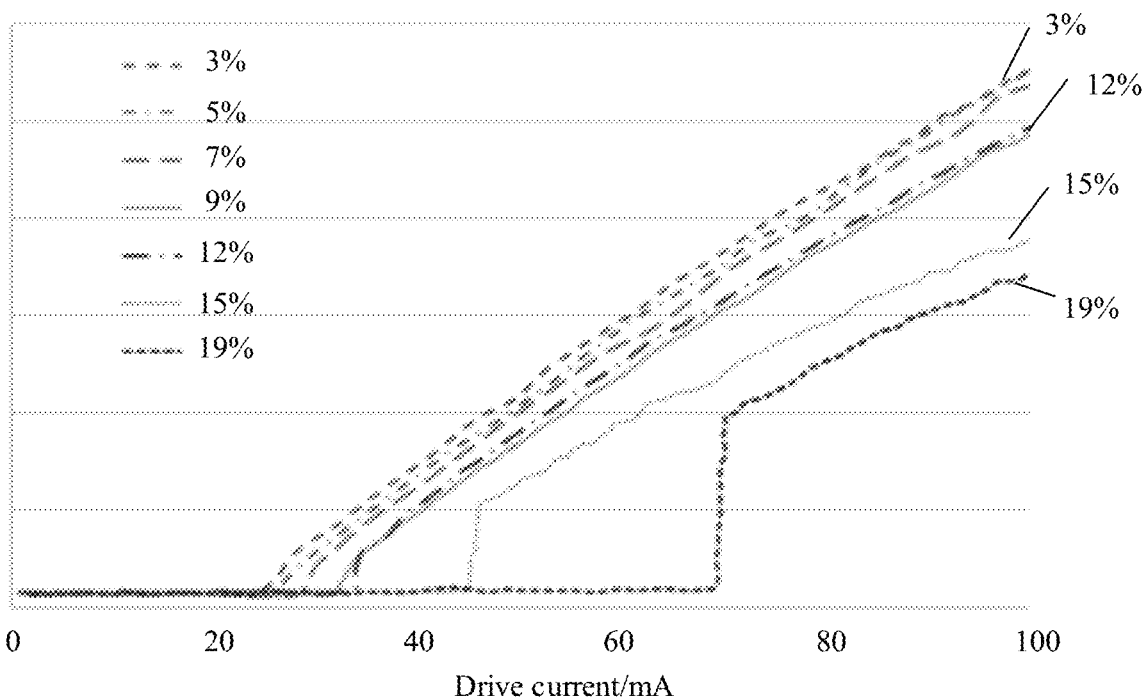
FIG. 3 is a schematic diagram of a relationship between a drive current and a proportion of a first electrode.

FIG. 3 is a schematic diagram of a relationship between a drive current and a proportion of a first electrode. It may be learned that, in a process that the proportion of the first electrode increases from 3% to 12%, the increase of the drive current is relatively small. However, in a process that the proportion of the first electrode increases from 12% to 15% or even 19%, the drive current increases greatly. In other words, a large drive current is required by the multi-wavelength laser to generate the laser light. Therefore, the proportion of the first electrode being less than or equal to 12% can reduce driving power consumption of the multi-wavelength laser.

It should be noted that a difference in a material of the waveguide 101 affects the relationship between the drive current and the proportion of the first electrode. Therefore, in an actual application, the proportion of the first electrode may be designed as required. For example, the proportion of the first electrode is less than or equal to 10%. This is not limited herein.

In an embodiment, as shown in FIG. 1, the waveguide 101 has a first end face 1011 and a second end face 1012, and the first end face 1011 and the second end face 1012 may be plated to enhance resonance in the waveguide 101. The first end face 1011 may be plated with a high reflection film whose reflectivity is greater than 99%. An optical signal in the waveguide 101 is output by the second end face 1012, and a reflectivity of a film plated on the second end face 1012 can be flexibly designed to adjust a drive current threshold for the multi-wavelength laser to generate the laser light and power for outputting the optical signal. It should be noted that a high reflection film whose reflectivity is greater than 99% may also be plated on the second end face 1012, an optical signal in the waveguide 101 is output by the first end face 1011, and a reflectivity of a film plated on the first end face 1011 may be flexibly designed. This is not limited herein. It may also be understood that the optical signal is the laser light generated in the waveguide 101.

Figure 4:
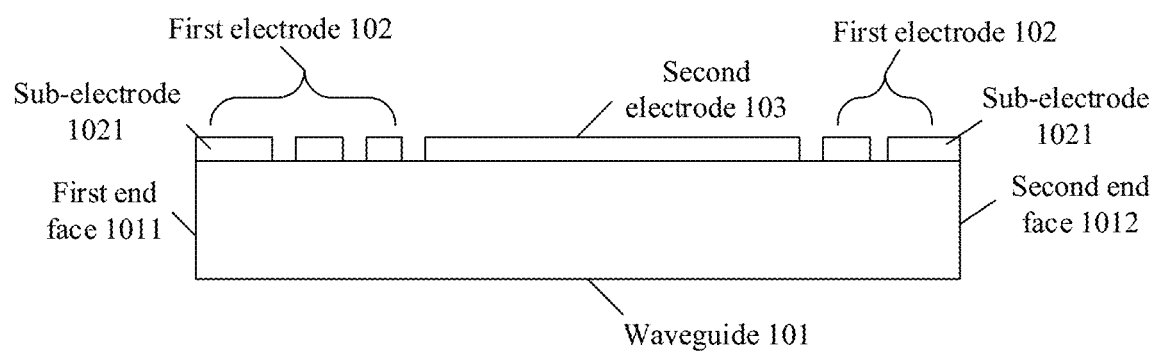
FIG. 4 is a schematic diagram of a structure of a second-type multi-wavelength laser according to an embodiment of this application.

FIG. 4 is a schematic diagram of a structure of a second-type multi-wavelength laser according to an embodiment of this application. A difference from the multi-wavelength laser shown in FIG. 1 lies in that a first electrode 102 is disposed on two sides of a second electrode 103. Specifically, the waveguide 101 is covered with a layer of electrode, two grooves are disposed on the electrode, and an electrode located between the two grooves is the second electrode 103. The electrodes on two sides of the second electrode 103 are the first electrodes 102. A quantity of sub-electrodes 1021 of the first electrode 102 may be set as required.

In an embodiment, a material of the waveguide 101 may include at least one or more of the following: a semiconductor quantum dot, a semiconductor quantum wire, or a semiconductor quantum well of gallium arsenide (GaAs), indium gallium arsenide (InGaAs), and indium phosphide (InP). It should be noted that, in an actual application, the material of the waveguide 101 includes but is not limited to the materials listed above.

In an actual application, there may be a plurality of different implementations for adjusting a wavelength of an optical signal in the waveguide 101. The manners are separately described below.

Figure 5A:
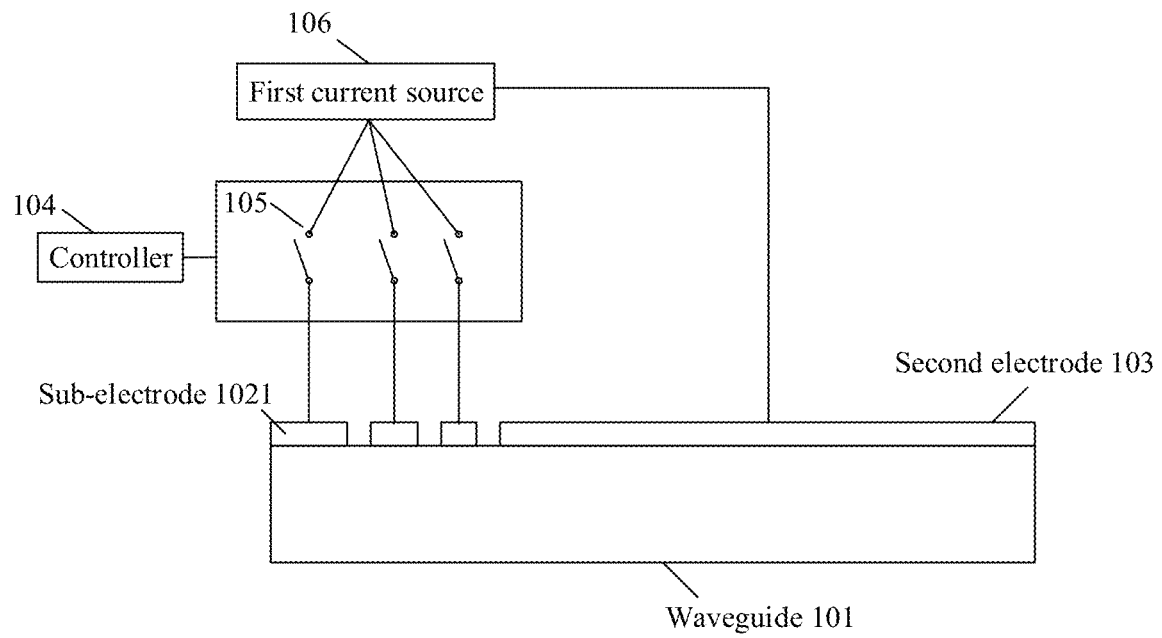
FIG. 5(a) is a schematic diagram of a structure of a third-type multi-wavelength laser according to an embodiment of this application.

First implementation: FIG. 5(a) is a schematic diagram of a structure of a third-type multi-wavelength laser according to an embodiment of this application. The multi-wavelength laser further includes a controller 104, a plurality of switches 105, and a first current source 106. Each switch 105 is in a one-to-one correspondence with each sub-electrode 1021 of the first electrode 102, one end of each switch 105 is connected to a corresponding sub-electrode 1021, the other end of the switch 105 is connected to a first current source 106, and the first current source 106 is connected to the second electrode 103. The controller 104 may load a current of the first current source 106 onto a corresponding sub-electrode 1021 by controlling the switch 105 to close.

Figure 5B:
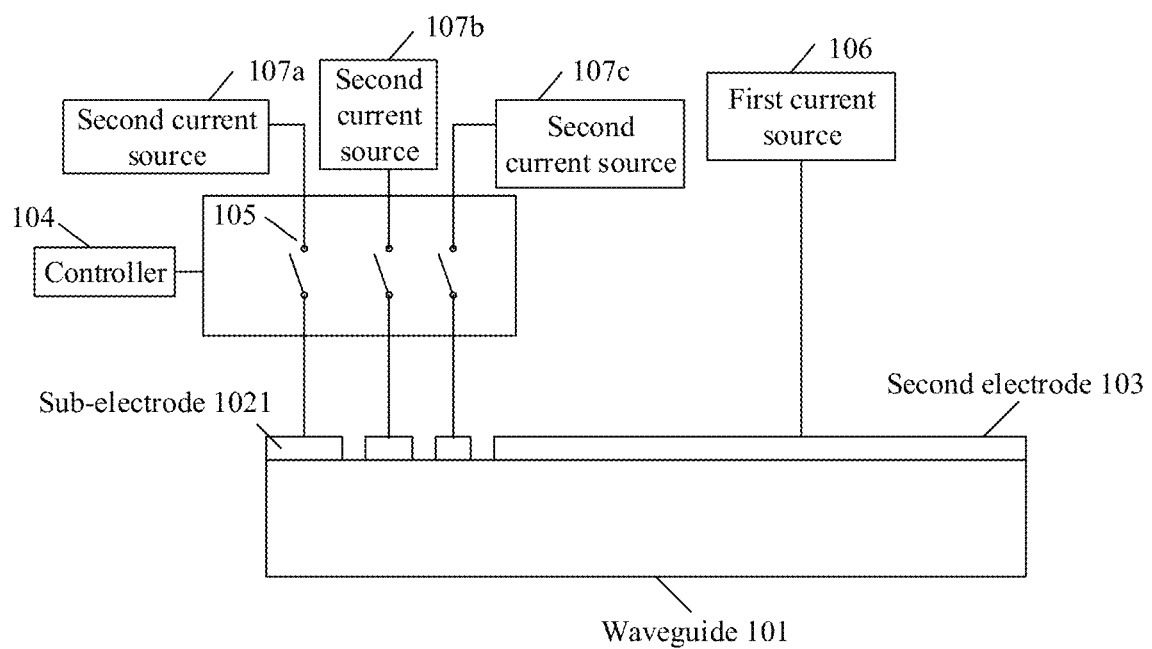
FIG. 5(b) is a schematic diagram of a structure of a fourth-type multi-wavelength laser according to an embodiment of this application.

Second implementation: FIG. 5(b) is a schematic diagram of a structure of a fourth-type multi-wavelength laser according to an embodiment of this application. The multi-wavelength laser includes a first current source 106 and a plurality of second current sources (such as a second current source 107a, a second current source 107b, and a second current source 107c). A quantity of second current sources is consistent with a quantity of switches 105, and there is a one-to-one correspondence between the second current sources and the switches 105. One end of each switch 105 is connected to a corresponding sub-electrode 1021, the other end of the switch 105 is connected to a corresponding second current source, and the first current source 106 is connected to the second electrode 103. The controller 104 may load a current of the second current source onto a corresponding sub-electrode 1021 by controlling the switch 105 to close.

It should be noted that a magnitude of a current loaded onto each sub-electrode 1021 affects a wavelength of an optical signal in the waveguide 101. Therefore, each sub-electrode is connected to a different second current source, so that an adjustable wavelength range of the optical signal in the waveguide 101 is larger.

Figure 5C:
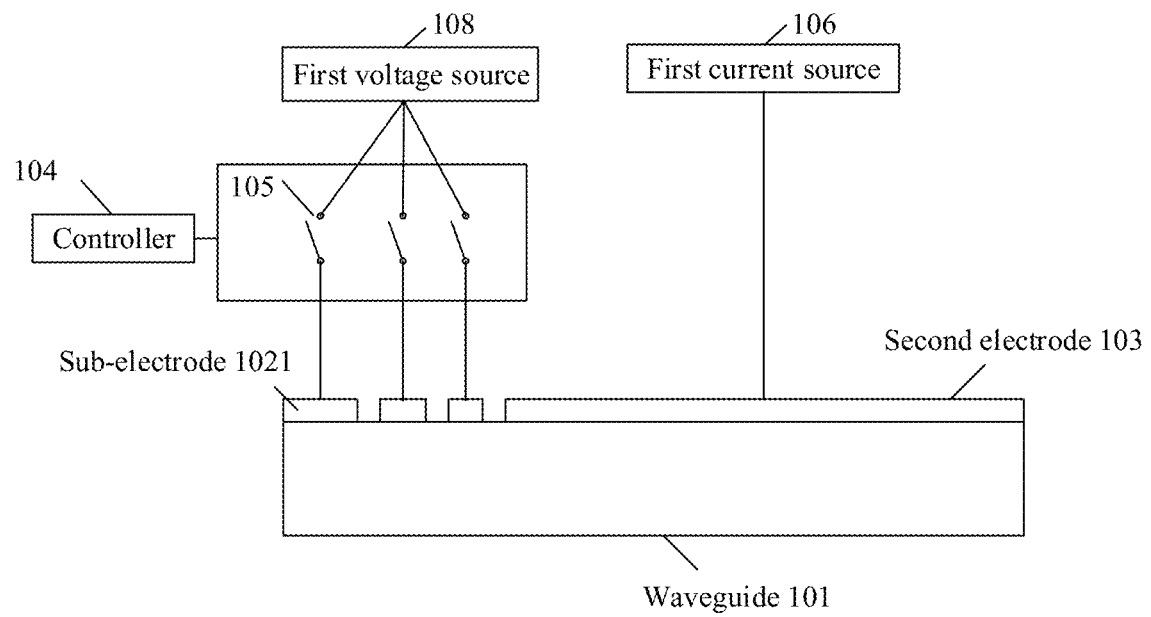
FIG. 5(c) is a schematic diagram of a structure of a fifth-type multi-wavelength laser according to an embodiment of this application.

Third implementation: FIG. 5(c) is a schematic diagram of a structure of a fifth-type multi-wavelength laser according to an embodiment of this application. The multi-wavelength laser includes a first current source 106 and a first voltage source 108. The first current source 106 is connected to the second electrode 103, one end of each switch 105 is connected to a corresponding sub-electrode 1021, and the other end of the switch 105 is connected to the first voltage source 108. The controller 104 may load a voltage of the first voltage source 108 onto a corresponding sub-electrode 1021 by controlling the switch 105 to close.

Figure 5D:
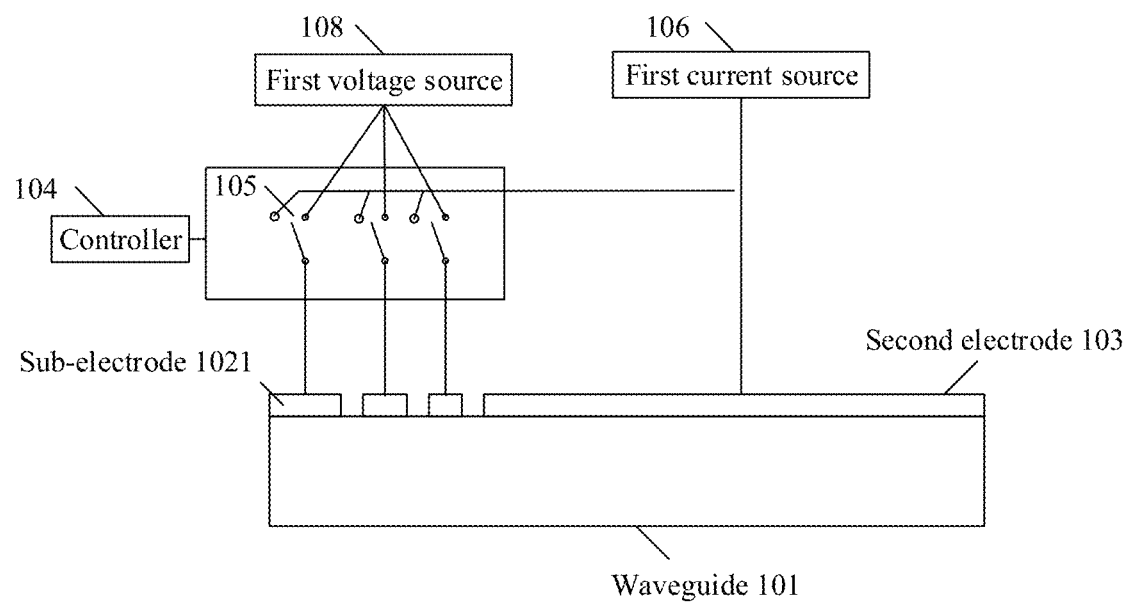
FIG. 5(d) is a schematic diagram of a structure of a sixth-type multi-wavelength laser according to an embodiment of this application.

Fourth implementation: FIG. 5(d) is a schematic diagram of a structure of a sixth-type multi-wavelength laser according to an embodiment of this application. The multi-wavelength laser includes a first current source 106 and a first voltage source 108. Each switch 105 is a dual-control switch, that is, each switch 105 may connect a sub-electrode 1021 corresponding to the switch 105 to the first current source 106, or may connect a sub-electrode 1021 corresponding to the switch 105 to the first voltage source 108. Specifically, one end of each switch 105 is fixedly connected to the sub-electrode 1021 corresponding to the switch 105, and the other end of the switch 105 may switch between two contacts. The two contacts are respectively connected to the first current source 106 and the first voltage source 108. By controlling the switch 105 to switch between the two contacts, the controller 104 can load a current of the first current source 106 or a voltage of the first voltage source 108 onto a corresponding sub-electrode 1021. In addition, the first current source 106 is connected to the second electrode 103. In this implementation, the sub-electrode 1021 can be loaded with a current or a voltage, thereby improving flexibility of this solution. It should be noted that the two contacts may also be referred to as another end and the other end respectively.

Figure 5E:
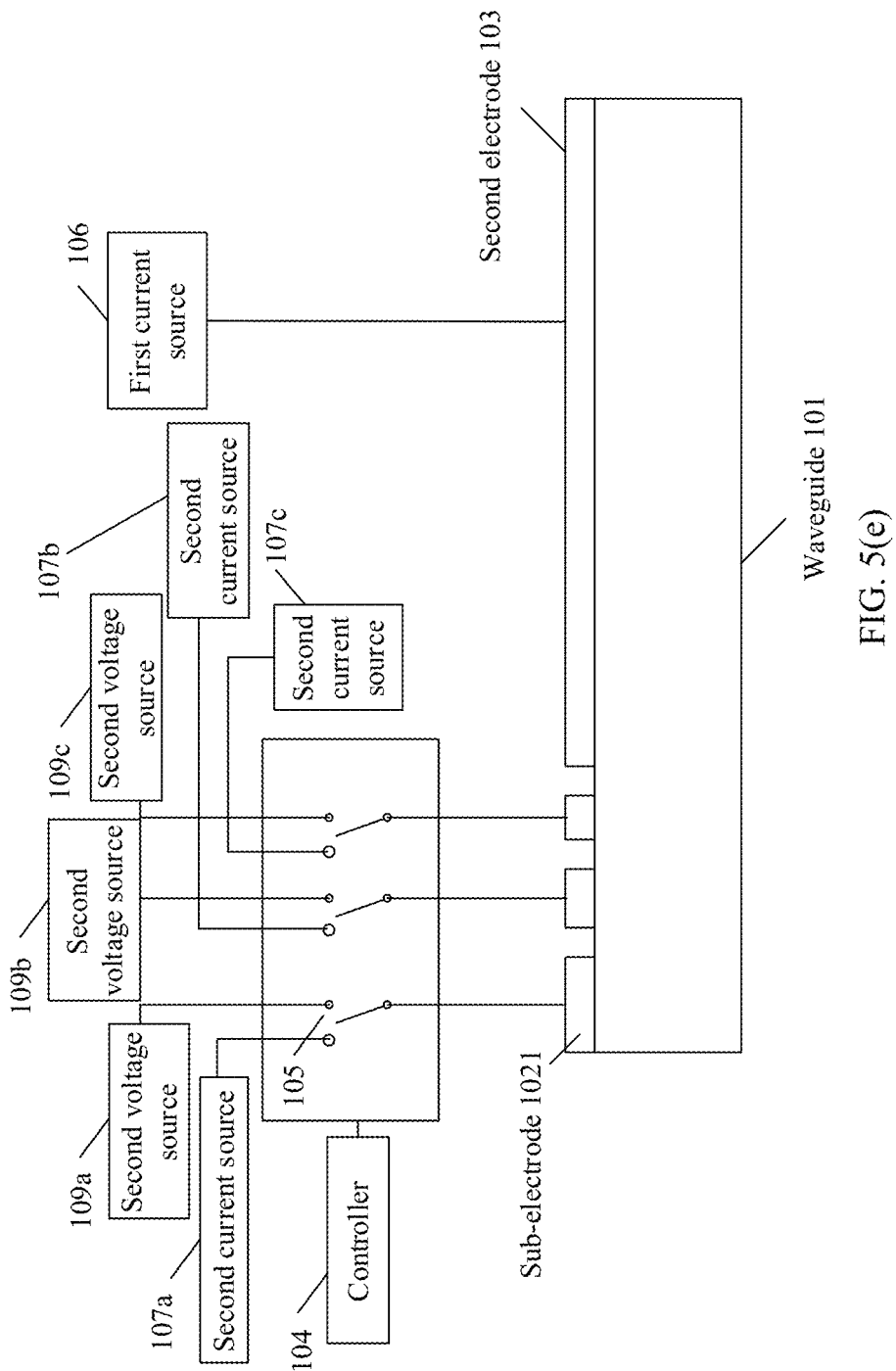
FIG. 5(e) is a schematic diagram of a structure of a seventh-type multi-wavelength laser according to an embodiment of this application.
Figure 5F:
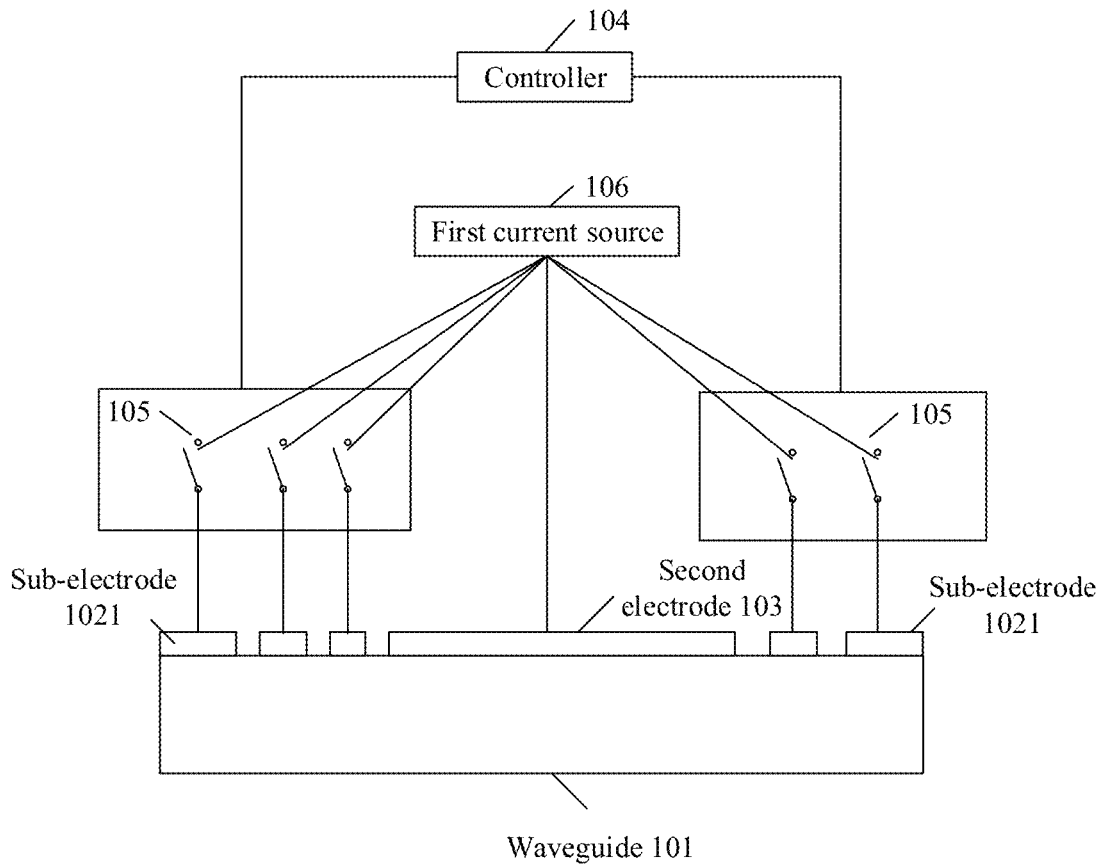
FIG. 5(f) is a schematic diagram of a structure of an eighth-type multi-wavelength laser according to an embodiment of this application.

Fifth implementation: FIG. 5(e) is a schematic diagram of a structure of a seventh-type multi-wavelength laser according to an embodiment of this application. The multi-wavelength laser includes a first current source 106, a plurality of second current sources (such as a second current source 107*a*, a second current source 107*b*, and a second current source 107*c*), and a plurality of second voltage sources (such as a second voltage source 109*a*, a second voltage source 109*b*, and a second voltage source 109*c*). A quantity of second voltage sources is consistent with a quantity of switches 105, and there is a one-to-one correspondence between the second voltage sources and the switches 105. Each switch 105 is a dual-control switch, that is, each switch 105 may connect a sub-electrode 1021 corresponding to the switch 105 to one of the second current sources, or may connect a sub-electrode 1021 corresponding to the switch 105 to one of the second voltage sources. Specifically, one end of each switch 105 is fixedly connected to the sub-electrode 1021 corresponding to the switch 105, and the other end of the switch 105 may switch between two contacts. The two contacts are respectively connected to one of the second current sources and one of the second voltage sources. By controlling the switch 105 to switch between the two contacts, the controller 104 can load a current of the second current source or a voltage of the second voltage source onto a corresponding sub-electrode 1021. In addition, the first current source 106 is connected to the second electrode 103. In this implementation, a magnitude of a voltage loaded onto each sub-electrode 1021 affects a wavelength of an optical signal in the waveguide 101. Therefore, each sub-electrode is connected to a different second voltage source, so that an adjustable wavelength range of the optical signal in the waveguide 101 is larger. In addition, the sub-electrode 1021 can be loaded with a current or a voltage, thereby improving flexibility of this solution.

Sixth implementation: FIG. 5(*f*) is a schematic diagram of a structure of an eighth-type multi-wavelength laser according to an embodiment of this application. A sub-electrode 1021 is disposed on two sides of the second electrode 103. Similar to that in FIG. 5(*a*), the multi-wavelength laser further includes a controller 104, a plurality of switches 105, and a first current source 106. Each switch 105 is in a one-to-one correspondence with each sub-electrode 1021 of the first electrode 102, one end of each switch 105 is connected to a corresponding sub-electrode 1021, the other end of the switch 105 is connected to a first current source 106, and the first current source 106 is connected to the second electrode 103. The controller 104 may load a current of the first current source 106 onto a corresponding sub-electrode 1021 by controlling the switch 105 to close. It may be understood that the implementations in FIG. 5(*b*) to FIG. 5(*e*) are also applicable to a structure in which a sub-electrode 1021 is disposed on two sides of the second electrode 103. The structure is not enumerated herein one by one.

In an embodiment, a manner of loading a current or a voltage onto a sub-electrode 1021 of the first electrode 102 includes but is not limited to the foregoing six implementations. It may be understood that the controller 104 may be a microcontroller unit (MCU).

It should be noted that a TEC may also be disposed in a packaging structure of the multi-wavelength laser in this application. Because a temperature of the TEC also affects a wavelength of an optical signal output by the multi-wavelength laser, a combination with temperature control makes the wavelength adjustment manner of the multi-wavelength laser in this application more flexible.

In an embodiment, as a working length of a first electrode changes, an optical field energy in a waveguide changes, and further a temperature in the waveguide changes. In this way, a wavelength range of an optical signal transmitted by the multi-wavelength laser can be quickly adjusted.

Based on the foregoing descriptions of the multi-wavelength laser, the following describes a wavelength control method corresponding to the laser. It should be noted that, description of an apparatus structure corresponding to the following wavelength control method may be same as the description the foregoing apparatus embodiment. However, it is not limited to the multi-wavelength laser described above.

Figure 6:
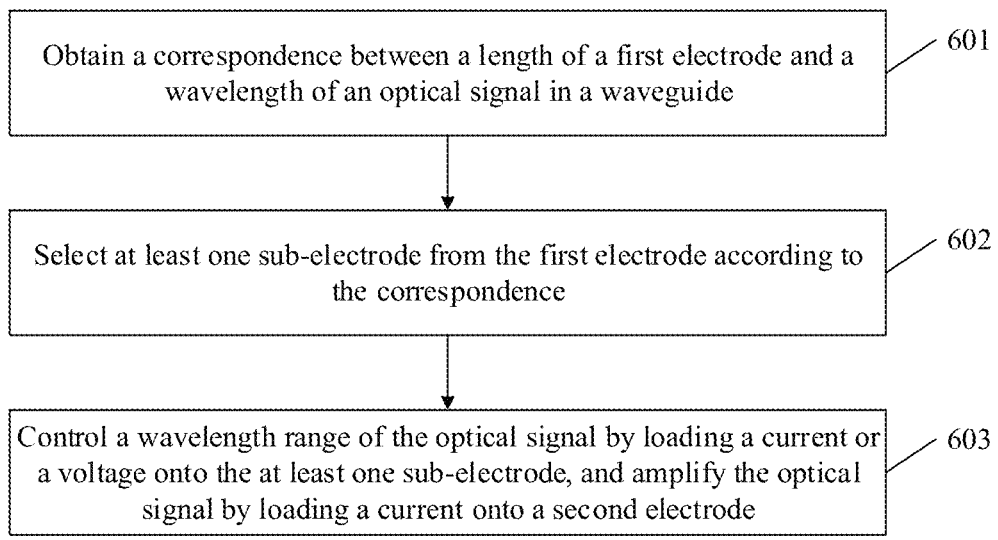
FIG. 6 is a schematic flowchart of a wavelength control method according to an embodiment of this application.

FIG. 6 is a schematic flowchart of a wavelength control method according to an embodiment of this application. In this example, the wavelength control method includes the following operations.

601: Obtain a correspondence between a length of a first electrode and a wavelength of an optical signal in a waveguide.

In an embodiment, because a working length of a first electrode 102 affects a wavelength of an optical signal in a waveguide 101, a correspondence between the length of the first electrode 102 and the wavelength of the optical signal in the waveguide 101 may be determined in advance, and the correspondence is stored by a multi-wavelength laser.

It should be noted that the correspondence is different when a current or a voltage loaded onto each sub-electrode 1021 is different. Therefore, in the examples of FIG. 5(*a*) to FIG. 5(*f*), the correspondence stored by the multi-wavelength laser is uniquely determined.

602: Select at least one sub-electrode 1021 from the first electrode according to the correspondence.

In an embodiment, the multi-wavelength laser may determine a target wavelength of an optical signal that needs to be output, then determine a length of a first electrode 102 corresponding to the target wavelength according to the correspondence, and further determine a sub-electrode 1021 to be used.

603: Control a wavelength range of the optical signal by loading a current or a voltage onto the at least one sub-electrode 1021, and amplify the optical signal by loading a current onto a second electrode.

After determining the sub-electrode 1021 to be used, a controller 104 of the multi-wavelength laser may control the wavelength range of the optical signal by loading a current or a voltage onto the selected sub-electrode 1021 and amplify the optical signal by loading a current onto the second electrode. The controller 104 may load a current or a voltage by controlling a switch 105 corresponding to the sub-electrode 1021 to close or switch. For details, refer to the implementations shown in FIG. 5(*a*) to FIG. 5(*f*). Details are not described again.

It should be noted that the foregoing embodiments are merely intended to describe the technical solutions of this application other than to limit this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:
1. A multi-wavelength laser, comprising:
a waveguide;
a first electrode disposed on the waveguide, wherein the first electrode comprises a plurality of sub-electrodes, and every two adjacent sub-electrodes of the plurality of sub-electrodes are electrically isolated; and a second electrode configured to amplify an optical signal in the waveguide, wherein a first current is loaded onto the second electrode to amplify the optical signal in the waveguide, and the first electrode and second electrode are electrically, isolated;

wherein a second current or a voltage is loaded onto at least one of the plurality of sub-electrodes to control a wavelength range of the optical signal in the waveguide.

2. The multi-wavelength laser according to claim 1, wherein each sub-electrode has a different length.

3. The multi-wavelength laser according to claim 1, wherein the first electrode has a first length that is a sum of lengths of all the sub-electrodes, wherein the second electrode has a second length and a ratio of the first length to a sum of the first length and the second length is less than or equal to 12%.

4. The multi-wavelength laser according to claim 1, wherein the first electrode is disposed on one side of the second electrode, or the first electrode is disposed on two sides of the second electrode.

5. The multi-wavelength laser according to claim 1, further comprising:

a plurality of switches corresponding to the plurality of sub-electrodes, wherein one end of each switch is connected to a sub-electrode corresponding to the switch, the other end of the switch is connected to a current source, wherein the second electrode is connected to the current source; and a controller configured to control each of the plurality of switches.

6. The multi-wavelength laser according to claim 1, wherein a material of the waveguide comprises at least one or more of the following: a semiconductor quantum dot, a semiconductor quantum wire, or a semiconductor quantum well of gallium arsenide (GaAs), indium gallium arsenide (InGaAs), and indium phosphide (InP).

7. A wavelength control method, comprising:

obtaining a correspondence between a length of a first electrode having a plurality of sub-electrodes disposed on a waveguide and a wavelength of an optical signal in the waveguide, wherein every two adjacent sub-electrodes of the plurality of sub-electrodes are electrically isolated;

selecting at least one sub-electrode from the plurality of sub-electrodes according to the correspondence; and controlling a wavelength range of the optical signal by loading a current or a voltage onto the at least one sub-electrode and amplifying the optical signal by loading a current onto a second electrode disposed on the waveguide, wherein the first electrode is electrically isolated from the second electrode.

8. The method according to claim 7, wherein each sub-electrode is connected to a first current source through a switch corresponding to the sub-electrode, or each sub-electrode is connected to a first voltage source through a switch corresponding to the sub-electrode; and wherein the controlling a wavelength range of the optical signal by loading a current or a voltage onto the at least one sub-electrode comprises:

controlling the wavelength range of the optical signal by connecting a switch corresponding to the at least one sub-electrode to the first current source or the first voltage source.

9. The method according to claim 7, wherein each sub-electrode has a different length.

10. The method according to claim 7, wherein the first electrode has a first length that is a sum of lengths of all the sub-electrodes, the second electrode has a second length, a ratio of the first length to a sum of the first length and the second length is less than or equal to 12%.

11. The method according to claim 7, wherein the first electrode is disposed on one side of the second electrode, or the first electrode is disposed on two sides of the second electrode.

12. The method according to claim 7, wherein a material of the waveguide comprises at least one or more of the following: a semiconductor quantum dot, a semiconductor quantum wire, or a semiconductor quantum well of gallium arsenide (GaAs), indium gallium arsenide (InGaAs), and indium phosphide (InP).

* * * * *